United States Patent [19]
Nishizaka

[11] Patent Number: 5,685,912
[45] Date of Patent: Nov. 11, 1997

[54] PRESSURE CONTROL SYSTEM FOR SEMICONDUCTOR MANUFACTURING EQUIPMENT

[75] Inventor: Hiroaki Nishizaka, Nagasaki, Japan

[73] Assignee: Sony Corporation, Japan

[21] Appl. No.: 665,443

[22] Filed: Jun. 18, 1996

[30] Foreign Application Priority Data

Jun. 20, 1995 [JP] Japan ................... 7-176576

[51] Int. Cl.$^6$ ................... C23C 16/00
[52] U.S. Cl. ............ 118/719; 118/715; 156/345
[58] Field of Search ............... 118/715, 719; 156/345

[56] References Cited

U.S. PATENT DOCUMENTS 5,250,092 10/1993 Nakano ................... 118/715

Primary Examiner—Richard Bueker
Attorney, Agent, or Firm—Ronald P. Kananen

[57] ABSTRACT

A vacuum process system for semiconductor manufacturing equipment provided with a vacuum chamber for processing semiconductor wafers under a prescribed vacuum pressure, wherein the vacuum process system is provided with an exhaust pipe connected to the vacuum chamber. A pressure control valve and exhaust control valve are provided in series with the exhaust closing valve provided on the exhaust pipe. The interior of the vacuum chamber is exhausted using the exhaust pump and the pressure control valve and exhaust control valve are controlled by the process controller. Thereby, the rising time and exhaust time are both shortened while supplying gas.

9 Claims, 5 Drawing Sheets

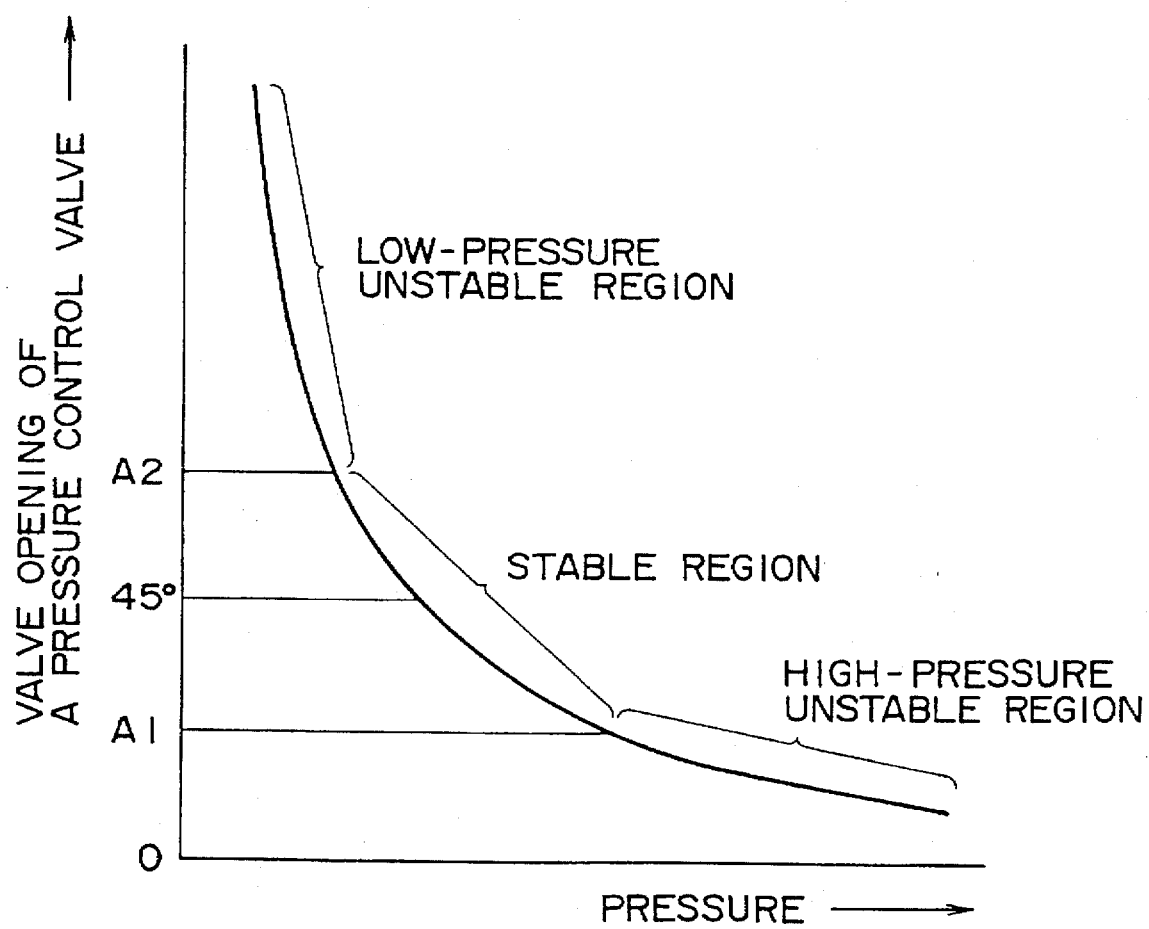
F I G. 2

A1 : PRESSURE RISING

B1 : WAFER PROCESSING

C1 : EXHAUSTING

LARGE CAPACITY PUMP

A2 : PRESSURE RISING

B2 : WAFER PROCESSING

C2 : EXHAUSTING

SMALL CAPACITY PUMP

1

PRESSURE CONTROL SYSTEM FOR SEMICONDUCTOR MANUFACTURING EQUIPMENT

BACKGROUND OF THE INVENTION

1. Field of the Invention

This invention relates to a vacuum process system for semiconductor manufacturing equipment. More particularly this invention relates to a vacuum exhaust means for a vacuum chamber used in vacuum processes such as etching and CVD.

2. Description of the Related Art

In a film forming process and a fine working process in a various semiconductor manufacturing processes, vacuum equipment such as reduced pressure CVD equipment, ion etching equipment, evaporation equipment, and spattering equipment is used. Such equipment is provided with a vacuum chamber in which wafers are variously processed under a vacuum condition and a vacuum exhaust means connected to the vacuum chamber.

FIG. 1 shows the main structure of a conventional vacuum process equipment used for vacuum process.

A gas supply pipe 2 for introducing a reaction gas to a vacuum chamber 1 is connected to the vacuum chamber 1. In the vacuum chamber, wafers to be processed in a vacuum (not shown in the figure) are placed. A gas supply valve 7 for supplying/closing a reaction gas is provided on the gas supply pipe 2. An exhaust pipe 8 connected to an exhaust pump 5 is connected to the vacuum chamber 1. An exhaust closing valve 3 for opening/closing the exhaust pipe 8 is provided on the exhaust pipe 8 and a pressure control valve 4 for controlling the pressure in the vacuum chamber 1 is provided in series with the exhaust closing valve 3. The pressure control valve 4 is connected to a controller 6 and the opening of the pressure control valve 4 is automatically controlled depending on a prescribed pressure.

In the vacuum process equipment having the above-mentioned structure, first the exhaust closing valve 3 of the exhaust pipe 8 is open while the gas closing valve 7 of the gas supply pipe 2 is in a closed condition, the pressure control valve 4 is fully opened (maximum flow condition), the exhaust pump 5 is operated and, the interior of the vacuum chamber 1 is evacuated to exhaust residual gas in the internal vacuum chamber and to evacuate the internal vacuum chamber to a prescribed vacuum condition. Then, the pressure control valve 4 is fully closed (minimum flow condition) and also gas closing valve 7 is opened to introduce a reaction gas into the vacuum chamber 1. Then the pressure in the vacuum chamber increases.

The pressure in the vacuum chamber 1 attains a prescribed value required for the process, in the vacuum condition a vacuum process is started and wafers are processed. During a vacuum process, the pressure in the vacuum chamber is maintained at a prescribed pressure by balancing the supply of a reaction gas flowing at a constant flow rate and the exhaust operation of the exhaust pump. The controller 6 controls automatically the valve opening of the pressure control valve 4 depending on the pressure in the vacuum chamber so that the internal vacuum chamber is maintained at a prescribed pressure required for the vacuum process. In detail, the opening of the pressure control valve 4 is feedback-controlled referring to a prescribed vacuum pressure as the target value, and the valve opening is controlled automatically so that the internal vacuum chamber 1 is maintained at a prescribed vacuum pressure by balancing the flow rate of a reaction gas supplied from the gas supply pipe 3 and the exhaust flow rate depending on the valve opening of the pressure control valve 4.

After the ending of the vacuum process of wafers, the gas closing valve 7 is closed to stop the supply of a reaction gas, and the pressure control valve 4 is fully opened to purge the internal vacuum chamber 1 and to exhaust the residual reaction gas in the vacuum chamber 1. After these procedures, vacuum processing of wafers is completed.

FIG. 2 is a graph for describing the relationship between the valve opening of the pressure control valve 4 and the pressure in the vacuum chamber 1. The valve of this pressure control valve is a valve in form of a butterfly valve; therefore, the valve opening angle range of 45±ten and several degrees is the stable range for stable controlling of the pressure. The minimum valve opening A1 in the stable controlling range is defined as the fully closed position and the maximum valve opening A2 is defined as the fully opened position; thus, the valve opening of the pressure control valve is controlled within the range from A1 to A2. If the valve opening is closed beyond A1 in FIG. 2, the exhaust flow rate is too low for keeping a balance between the exhaust flow rate and the charging flow rate of a-reaction gas into the chamber; thus, an the unbalance results in the excessive pressure (vacuum pressure is insufficient), and under this condition, a slight increase in the valve opening causes an excessive increase in the pressure, so that, the pressure can not be controlled stably. Contrary to the above-mentioned closed opening, if the valve opening is opened beyond A2 in FIG. 2, the exhaust flow rate is excessive for keeping a balance between the exhaust flow rate and the charging flow rate of a reaction gas into the chamber, the unbalance results in an excessively low pressure (vacuum is excessive); thus under this condition, the change in the valve opening results in only a slight change in the pressure, so that the pressure is difficult to be controlled.

Therefore, to control the pressure control valve within the stable control range between A1 and A2 only an exhaust pump having an exhaust capacity in a prescribed range matching a vacuum pressure to be prescribed is limitedly used for a given gas flow rate into the vacuum chamber. In other words, a reaction gas supply into the vacuum chamber and a prescribed pressure for a vacuum process are given, then, the exhaust capacity of an exhaust pump which can be used stably is fixed to some value, and if an exhaust pump having an exhaust capacity is not matching, the valve opening can not be controlled within the stable range (A1 to A2).

FIG. 3A and FIG. 3B are graphs for describing the change in pressure in the vacuum chamber with time when a large capacity pump having a large capacity is used and a small capacity pump having a small capacity is used respectively. The abscissa represents the time starting from the time point when the gas closing valve is opened and the ordinate represents the pressure in the vacuum chamber. For the large exhaust capacity pump in FIG. 3A, A1 represents the pressure rising step up to a desired prescribed pressure, B1 represents the wafer processing step for a vacuum process maintaining the prescribed pressure, and C1 represents the exhaust step for purging the reaction gas in the chamber after the completion of the vacuum processing, and time for A1, B1, and C1 is represented by t1, t2, and t3 respectively, while the total time is represented by t0. For the small exhaust capacity pump in FIG. 3B, A2 represents the pressure rising step up to a desired prescribed pressure, B2 represents the wafer processing step for a vacuum process maintaining the prescribed pressure, and C2 represents the exhaust step for purging the reaction gas in the chamber after the completion of the vacuum processing, and time for A2, B2, and C2 is represented by T1, T2, and T3 respectively, and the total time is represented by T0. As shown in FIG. 3A for the large exhaust capacity pump, the rising time up to the prescribed pressure t1 is long, and the exhaust time t3 for exhausting the gas is short. On the other hand, for the small exhaust capacity pump in FIG. 3B, the rising time up to the prescribed pressure T1 is short, and the exhaust time T3 for exhausting the gas is long.

As described herein above, to use a pressure control valve within the valve opening range in the stable control region, an exhaust pump to be used is limited depending on a prescribed pressure for a vacuum process. As long as the condition is limited as described herein above, it is difficult to shorten the total process time by selecting a suitable exhaust pump, since the rising time up to a prescribed pressure and the exhaust time for exhausting a reaction gas are in a trade-off relationship, and the use of a pump having a large exhaust capacity or having a small exhaust capacity results in a long rising time or long exhaust time any way.

The pressure range operable with the same pump is limited because of the valve opening characteristics of the pressure control valve, for a process involving a prescribed pressure exceeding the range of the stable control region, another pump must be used. The switching from one pump to another pump requires a troublesome and time-consuming effort for the vacuum process, and results in reduced throughput.

OBJECTS AND SUMMARY OF THE INVENTION

It is the first object of a present invention to provide a vacuum process system for manufacturing elements having a wide pressure range for a stable control region, in which vacuum process system an exhaust pump is used for a wide range of vacuum pressure and is applied to various vacuum processes for a wide range of pressure.

It is a second object of the present invention to provide a vacuum process system for manufacturing elements which enables a shortening of both rising time and exhaust time, and the resultant total process time.

To attain the above-mentioned objects, the present invention provides a vacuum process system for semiconductor manufacturing equipment provided with:

a vacuum chamber for processing semiconductor wafers under a prescribed vacuum pressure prescribed for each process, a gas supply pipe connected to the vacuum chamber for inducing a reaction gas, a gas closing valve provided on the gas supply pipe, an exhaust pump for evacuation connected to the vacuum chamber through an exhaust pipe, an exhaust closing valve provided on the exhaust pipe, a pressure control valve provided on the exhaust pipe in series with the exhaust closing valve, and control means for controlling the valve opening of the pressure control valve depending on the prescribed vacuum pressure, wherein an exhaust control valve is provided on the exhaust pipe.

In a preferred embodiment, the exhaust control valve is connected to the control means, the control means controls the valve opening of the pressure control valve depending on the vacuum pressure in the vacuum chamber referring to the prescribed vacuum pressure as a target value, and also the valve opening of the exhaust control valve is set so as to be operated within the range of the prescribed stable control region.

In another preferred embodiment, the vacuum exhaust system for semiconductor manufacturing equipment is structured so that each exhaust pipe of a plurality of vacuum chambers is connected to a common exhaust pump, and the exhaust closing valve, pressure control valve, and the exhaust control valve are provided on each exhaust pipe individually.

First, the interior of the vacuum chamber is evacuated, and a reaction gas is introduced to the interior of the vacuum chamber to increase the vacuum pressure up to a prescribed pressure. While the pressure rises, the exhaust control valve is throttled to reduce exhausting, so that this operation simulates substantially the use of an exhaust pump having a small capacity. Thereby, the rising time required for evacuation to a certain required vacuum pressure is shortened. When the interior of the vacuum chamber is purged after the completion of the vacuum process, the exhaust control valve and the pressure control valve are both fully opened so that, this operation simulates substantially the use of an exhaust pump having a large capacity. Thus, the total exhaust time is shortened.

In other words, providing the exhaust control valve on the exhaust pipe connected to a pump having a large exhaust capacity allows the reduced exhaust capacity of the exhaust pump by throttling the exhaust control valve while the pressure rises to the prescribed pressure, and the rising characteristics like those of a small capacity pump are obtained as shown in FIG. 3B. On the other hand, the exhaust control valve is fully opened during the exhaust, and the exhaust characteristics like that of a large capacity pump are obtained as shown in FIG. 3A. Thus, the rising time is shortened and also the exhaust time is shortened by rendering both pump characteristics.

When the pressure control valve is controlled within a range where the valve opening is in the stable control region, and the valve opening is at the critical position of pressure control, namely a fully closed position (A1 in FIG. 2) or a fully opened position (A2 in FIG. 2), the adjusting of the valve opening of the exhaust control valve allows the pressure control beyond the critical pressure, thus the pressure in the vacuum chamber is controllable in a wider range within the stable control region.

As described herein above, the stable control region is widened, thereby, so that a large exhaust capacity pump is possible to control the pressure as a small exhaust capacity pump can control the pressure even though, such control is impossible with a large capacity exhaust pump conventionally: therefore, a single exhaust pump having a given exhaust capacity is used for a wider pressure range of various vacuum processes; Thus the usability of the vacuum process system is enhanced, and a process time is shortened.

An exhaust pump is used over the wide pressure range as described hereinabove only by providing the exhaust control valve on the exhaust pipe of an existing system, and the exhaust control valve renders substantially the same advantage as the switching of exhaust pump.

Further, a plurality of vacuum chambers are connected to a single large exhaust capacity pump and an exhaust control valve is provided on each exhaust pipe; thereby, an efficient vacuum process system is realized, and, the productivity is improved.

BRIEF DESCRIPTION OF THE DRAWINGS

FIG. 2 is a graph for describing the relationship between the valve opening of a pressure valve and the pressure in a vacuum chamber.

FIGS. 3A and 3B are a set of graphs, wherein FIG. 3A is a graph for a large capacity pump and 3B is a graph for a small capacity pump.

DETAILED DESCRIPTION OF THE PREFERRED EMBODIMENTS

Figure 1:
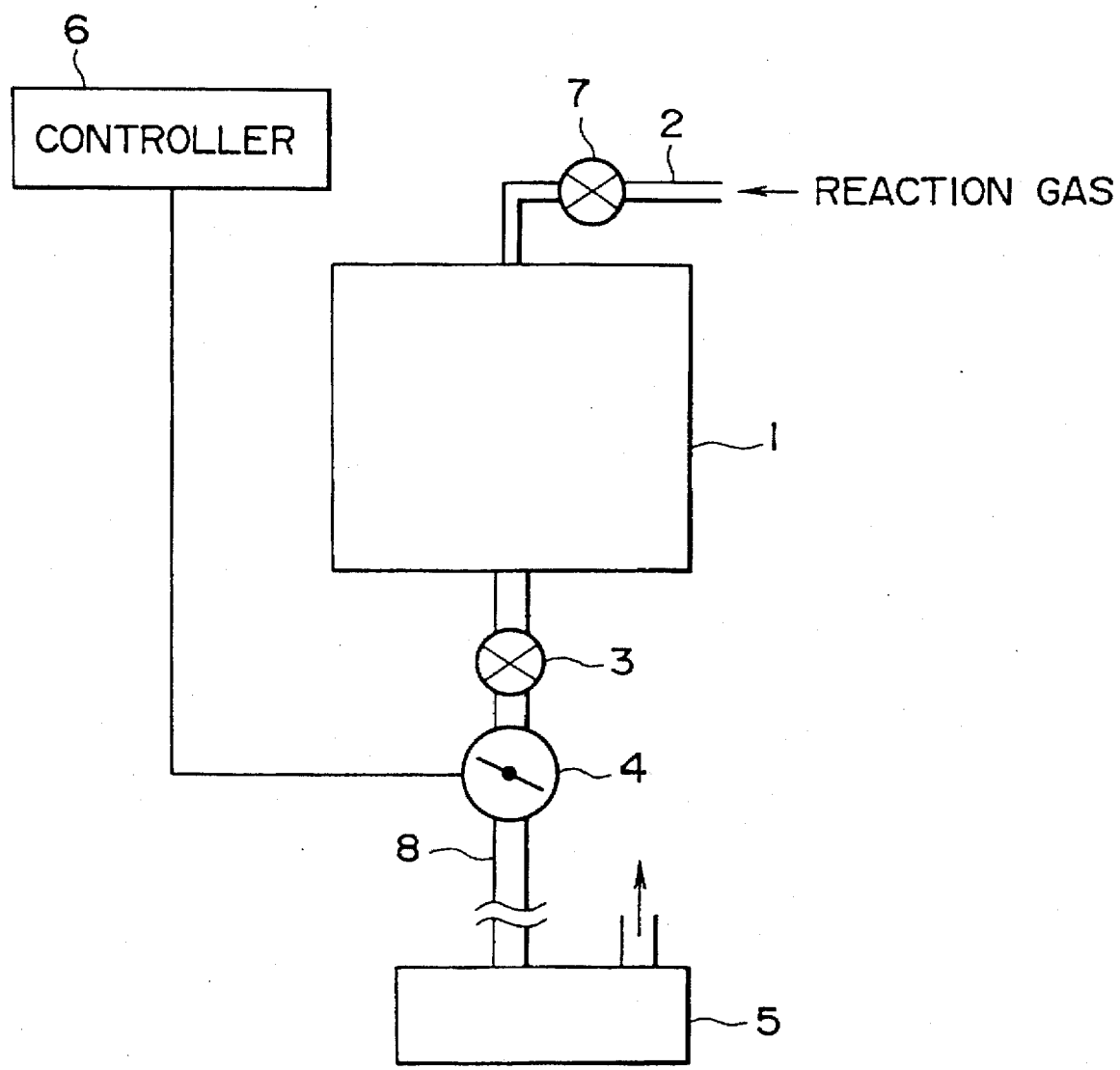
FIG. 1 is a schematic diagram of the main structure of a conventional vacuum process system.

Embodiments of the present invention will be described in detail referring to the drawings.

Figure 4:
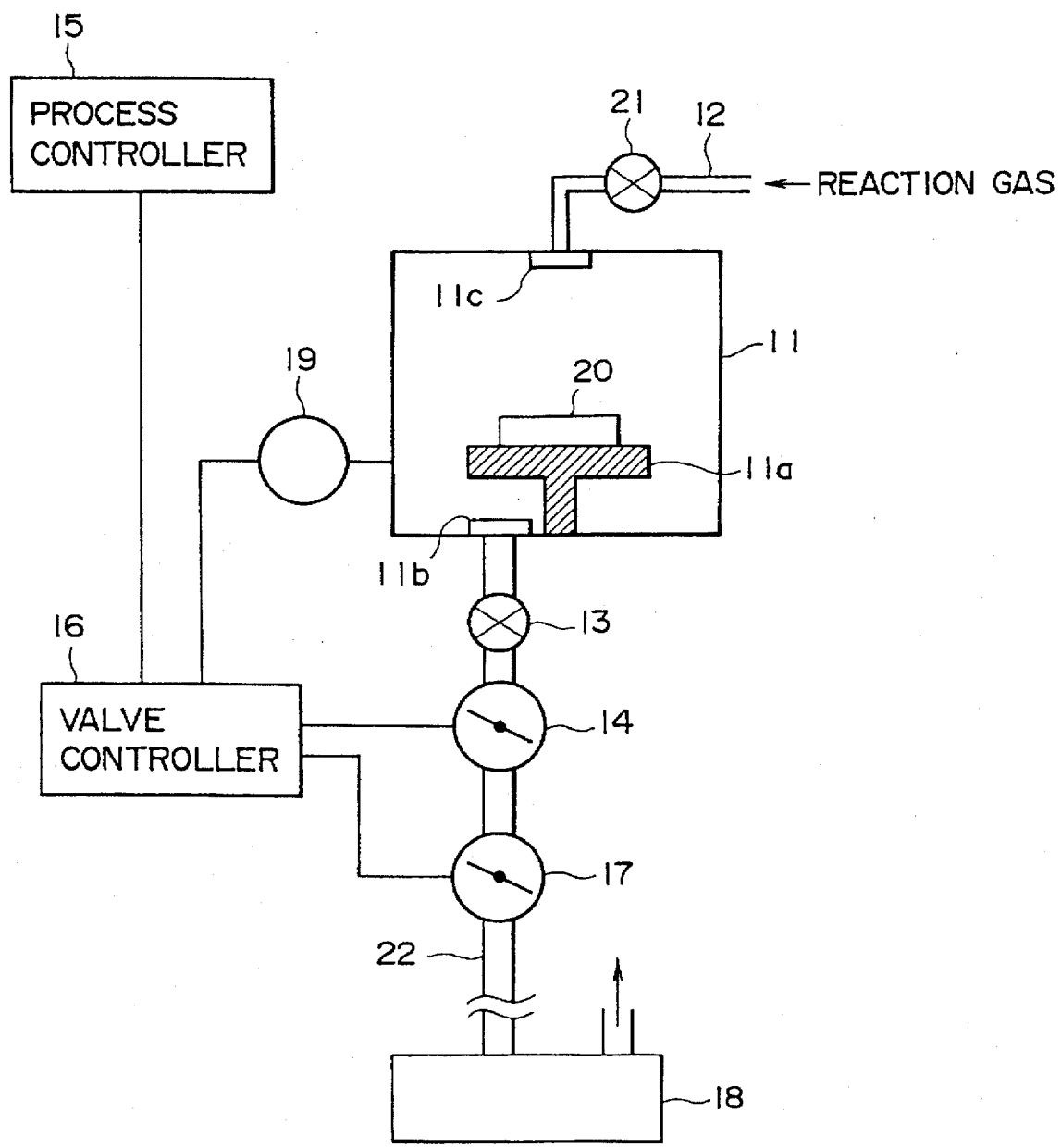
FIG. 4 is a schematic diagram of a vacuum process system in accordance with the present invention.

FIG. 4 is a schematic diagram of the main structure of one embodiment of a vacuum system for manufacturing semiconductor in accordance with the present invention.

In a vacuum chamber 11, a wafer holder 11a having a fixing means (not shown in the figure) such as vacuum chucking type and electrostatic chucking type holder for setting wafers to be subjected to a vacuum process is provided. At the top of the vacuum chamber 11, a gas supply inlet 11c for introducing a reaction gas necessary for vacuum processing such as etching and spattering is mounted, and a gas supply pipe 12 is connected to this gas supply inlet 11c. A gas closing valve 21 for supplying/interrupting a reaction gas is provided on the gas supply pipe 12. On the bottom of the vacuum chamber 11, an exhaust outlet 11b is provided, and an exhaust pipe 22 connected to an exhaust pump 18 is connected to this exhaust outlet 11b. To the exhaust pipe 22, an exhaust closing valve 13 for opening/closing the exhaust pipe 22 is provided, and a pressure control valve 14 for controlling the pressure in the vacuum chamber 11 is provided in series with the exhaust closing valve 13. In addition, between the pressure control valve 14 on the exhaust pipe 22 and the exhaust pump 18, a exhaust control valve 17 for controlling exhaust is provided. The pressure control valve 14 and exhaust control valve 17 are both connected to a valve controller 16, the valve opening is controlled automatically depending on a prescribed pressure. The valve controller 16 is connected to a process controller 15. The process controller 15 has a program for controlling a sequence of the whole process; according to the program, the process controller 15 supplies vacuum pressure condition data for a vacuum process to the valve controller 16. Based on this information, the valve controller 16 drives a servo motor (not shown in the figure) and control automatically the valve opening so that the valve opening is matched to the prescribed pressure.

The vacuum process using the vacuum process system having the above-mentioned structure is carried out as described herein under. First, the exhaust closing valve 13 on the exhaust pipe 22 is opened while the gas closing valve 21 on the gas supply pipe 12 is kept closed, and the pressure control valve 14 and exhaust control valve 17 are both opened. Then, the pressure control valve 14 and exhaust control valve 17 are fully opened, but, the range of the valve opening is defined within 45 ± ten and several degrees (the above-mentioned stable control region), therefore, the fully opening means the maximum flow rate condition within the range. In this condition, the exhaust pump 18 is operated to evacuate the interior of the vacuum chamber 11 and to exhaust residual gas in the interior, and the interior is evacuated to a prescribed high vacuum condition corresponding to the exhaust pump capacity (exhaust capacity).

Then, the pressure control valve 14 is fully closed (minimum flow rate condition), and the exhaust control valve 17 is adjusted to a previously prescribed valve opening. Then, the gas closing valve 21 is opened to introduce a reaction gas into the vacuum chamber 11. Then the pressure in the vacuum chamber 11 rises (pressure rising condition). In this condition, the exhaust is reduced by the exhaust control valve 17, thereby, the exhaust condition, if a large exhaust pump is used, simulates the exhaust condition when an exhaust pump having a small exhaust capacity is used, so that the rising time is shortened. The reason for fully closing the pressure control valve 14 during the operation as mentioned above is that the rising time is shortened as short as possible by reducing the exhaust flow rate to the minimum. Then, the program may be designed so that the exhaust control valve 17 is also adjusted to the minimum valve opening to shorten the pressure rising time and return to the prescribed valve opening when the pressure attains the prescribed pressure. When the vacuum pressure in the vacuum chamber 11 reaches the prescribed value required for the vacuum process, the pressure is maintained constant; in this condition, a vacuum process such as etching and spattering is carried out. The pressure is maintained constant at the prescribed pressure, by supplying a reaction gas at a constant flow rate into the vacuum chamber 11 while the exhaust pump 18 is operated to exhaust the reaction gas; thus, the pressure is balanced between the supply of the reaction gas and exhaust flow rate to the prescribed pressure. The valve controller 16 reads the valve opening signal of the pressure control valve 14 prescribed previously by the process controller 15 and the pressure signal obtained by detecting the current pressure in the vacuum chamber 11 using a vacuum gauge 19, and controls the valve opening of the pressure control valve 14 so that the vacuum pressure required for the vacuum process is maintained. In other words, the valve opening of the pressure control valve 14 is feedback-controlled referring to the prescribed vacuum pressure as a target value, and the valve opening is controlled automatically so that the interior of the vacuum chamber 11 is maintained at the prescribed vacuum pressure by balancing the flow rate of the reaction gas supplied from the gas supply pipe 12 and the exhaust flow rate depending on the valve opening of the pressure control valve 14. Then, the exhaust control valve 17 is set at the certain valve opening depending on the process pressure so that the valve opening of the pressure control valve 14 is operated within the range of the above mentioned stable control region consistently; thereby, the exhaust flow rate of the exhaust pump 18 is reduced.

After completion of the vacuum processing of the wafers, the gas closing valve 21 is closed to interrupt the supply of the reaction gas, and the pressure control valve 14 and exhaust control valve 17 are fully opened to purge the interior of the vacuum chamber and exhaust residual reaction gas in the chamber. Thus, the vacuum process of the wafers is completed.

Figure 5:
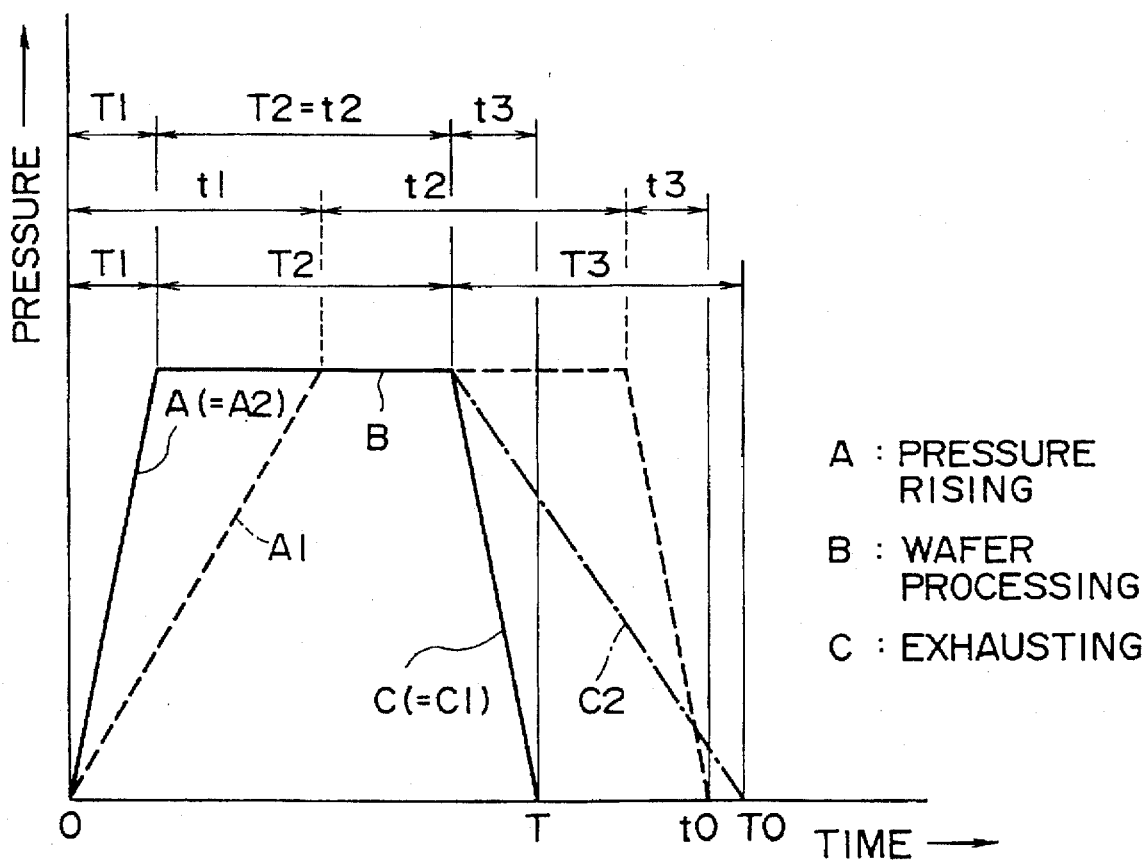
FIG. 5 is a graph for describing the relationship between time and pressure for a vacuum chamber of the embodiment in FIG. 4.

FIG. 5 is a graph for describing the pressure change in the vacuum chamber of the vacuum process system in accordance with the above-mentioned embodiment. Similarly to the graph shown in FIG. 3, the abscissa represents the time starting from the time point when the gas closing valve for introducing the reaction gas is opened, and the ordinate represents the pressure in the vacuum chamber. Solid lines A, B, and C respectively correspond to the pressure rising time, wafer processing time, and exhaust time in this embodiment. As described hereinbefore, in this embodiment, by throttling the exhaust control valve 17, the pressure rising time A is shortened to the same as the pressure rising time A2 using an exhaust pump having a small capacity shown in FIG. 3B so that, only a short time (T1) is required to reach the pressure required for the vacuum process. In the figure, the rough dotted line indicates the pressure change when a large capacity pump is used as shown in FIG. 3A, and indicates the rising time A1 for the system having no exhaust control valve of the embodiment.

Figure 3A:
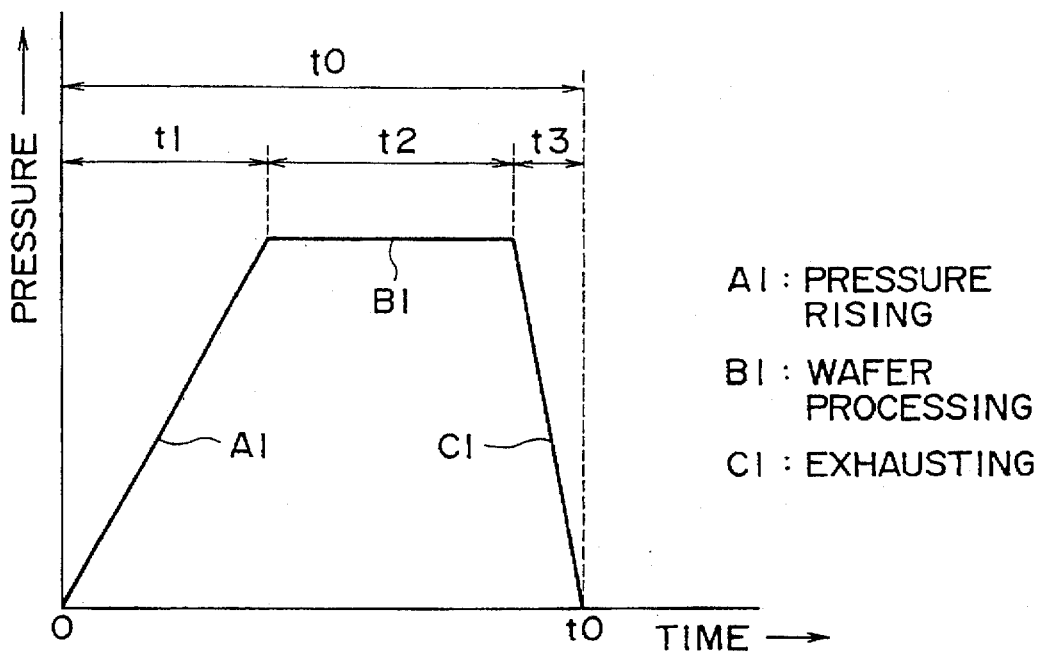
Figure 3B:
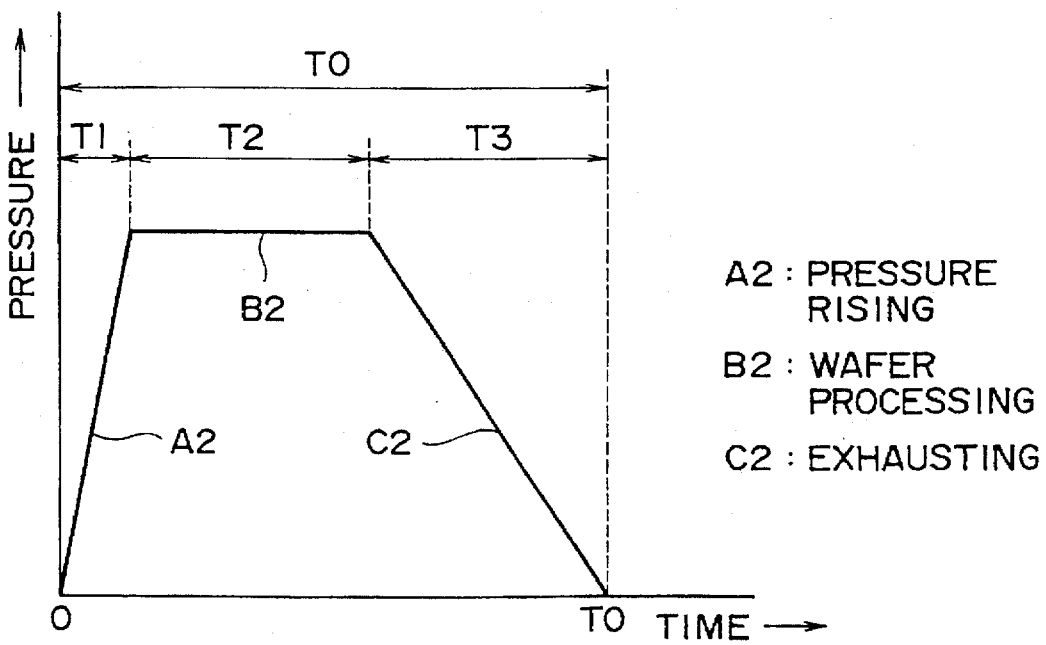

By fully opening the exhaust control valve 17 to exert the full exhaust capacity, the exhaust time C of the embodiment of the present invention is shortened to the same as the exhaust time C1 using an exhaust pump having a large capacity shown in FIG. 3A so that, only short time (t3) is required for exhaust the interior of the vacuum chamber. In the figure, the dashed line indicates the pressure change when a small capacity pump is used as shown in FIG. 3B, and indicates the exhaust time C2 for the system in which a large capacity pump can not be used unlike the embodiment of the present invention. In the graphs described hereinbefore, the rising time and exhaust time when a large capacity pump is used and a small capacity pump is used are shown individually in FIG. 3A and FIG. 3B, wherein the shorter exhaust time due to the large capacity pump and the shorter rising time due to the small capacity pump are taken up, and combined; thus, the total process time can be shortened.

In the above-mentioned embodiment, it is possible to use an exhaust pump having a large exhaust capacity depending on the pressure required for the process. Conventionally such a large capacity pump can not be used because the valve opening would be out of the range of the stab the exhaust control. By providing the exhaust control valve, which is described in the above-mentioned embodiment, on the exhaust pipe connected to an existing large exhaust capacity pump, a process which can be performed conventionally only using a small exhaust capacity pump can be performed using a large exhaust pump. When a conventional pump is used, by controlling the valve opening of the exhaust control valve, the width of the stable control region is widened, and the pressure is controlled precisely in the wider flow rate range. A plurality of processes with different prescribed pressures can be performed using a single large capacity pump; therefore, a plurality of chambers is connected to a common exhaust pump to form an integrated vacuum process system. The vacuum process system in accordance with the above-mentioned embodiment is applied to equipment for processing wafers under a vacuum condition such as spattering equipment, ion etching equipment, evaporation equipment, reduced pressure CVD equipment, ion implantation equipment, and the like for manufacturing semiconductors.

As described hereinbefore, in the present invention, only by simple additional structuring in that the exhaust control valve is provided on the exhaust pipe connected to the vacuum chamber in addition to the conventional pressure control valve, the controllable range of the exhaust pump capacity is widened. Therefore, a large exhaust capacity pump is used in the present invention, when pressure is rising at the starting of a process, the exhaust control valve is throttled to reduce the exhaust and to simulate substantially the use of an exhaust pump with a small capacity, and the rising time to reach the required vacuum pressure is shortened. When purging the interior of the vacuum chamber after completion of the vacuum process, the exhaust control valve and pressure control valve are fully opened to exert fully the large exhaust pump capacity, and the exhaust time is shortened.

By adjusting the valve opening of the exhaust control valve, the valve opening range in the stable control region of the pressure control valve is widened, and the pressure controllable range is widened. Therefore, the pressure range of the vacuum process performed by a single exhaust pump having a certain exhaust capacity is widened; thereby, the usability of the vacuum process system is enhanced, the process is performed efficiently, and the productivity is improved.

Only by providing an exhaust control valve on the exhaust pipe of an existing system, the usable pressure range of the exhaust pipe is widened as described herein above, thus, substantially the same advantage as that of pump switching is brought to the vacuum process system without cost and manpower.

By connecting a plurality of vacuum chambers to a single large exhaust pump and providing an exhaust control valve on each exhaust pipe, an efficient vacuum process system is structured, and the productivity is improved.

What is claimed is:

1. A vacuum process system for element manufacturing equipment provided with;

a vacuum chamber for processing semiconductor wafers under a prescribed vacuum pressure prescribed for each process, a gas supply pipe for introducing a reaction gas connected to said vacuum chamber, a gas closing valve provided on said gas supply pipe, an exhaust pump for evacuation connected to the said vacuum chamber through an exhaust pipe, an exhaust closing valve provided on said exhaust pipe, a pressure control valve provided on said exhaust pipe in series with said exhaust closing valve, an exhaust control valve provided on said exhaust pipe, and control means for controlling the valve opening of said pressure control valve depending on said prescribed vacuum pressure.

2. A vacuum process system for element manufacturing equipment as claimed in claim 1, wherein said exhaust control valve is connected to said control means, said control means is structured so as to control the valve opening of said pressure control valve depending on the vacuum pressure in said vacuum chamber referring to said prescribed vacuum pressure as a target, and to set the valve opening of said exhaust control valve for operation of said pressure control valve within the range of the prescribed stable control region of the valve opening of said pressure control valve.

3. A vacuum process system for element manufacturing equipment using the vacuum process system as claimed in claim 1, wherein each exhaust pipe of a plurality of vacuum chamber is connected to a common exhaust pump, and said exhaust closing valve, pressure control valve, and exhaust control valve are provided on each exhaust pipe.

4. A vacuum process system for element manufacturing equipment as claimed in claim 2, wherein said exhaust control valve is throttled by said control means, when pressure is rising at the starting of the process, to reduce the exhaust flow rate and to result in a shortened rising time to reach the required vacuum pressure.

5. A vacuum process system for element manufacturing equipment as claimed in claim 2, wherein said exhaust control valve and said pressure control valve are fully opened, when the interior of said vacuum chamber is purged after the completion of the vacuum process, a result in a shortened exhaust time.

6. A vacuum process system for element manufacturing equipment as claimed in claim 1, wherein the first pump having a first exhaust capacity and the second pump having a second exhaust capacity are provided instead of said exhaust pump for evacuation.

7. A vacuum process system for element manufacturing equipment as claimed in claim 6 wherein the first exhaust pump capacity is differentiated from the second exhaust pump capacity, and the first pump having the first exhaust capacity smaller than the second exhaust capacity is used during the pressure rising time to result in a shortened rising time to reach the required vacuum pressure.

8. A vacuum process system for element manufacturing equipment as claimed in claim 7, wherein said second pump having a larger exhaust capacity is used to exhaust the interior of said vacuum chamber during the exhaust time to result in a shortened exhaust time.

9. A vacuum process system for element manufacturing equipment as claimed in claim 2, wherein said pressure control valve and exhaust control value are sent by said control means using a servo motor.

* * * * *